US010454430B2

(12) United States Patent
Gramegna

(10) Patent No.: US 10,454,430 B2
(45) Date of Patent: Oct. 22, 2019

(54) CIRCUIT WITH VOLTAGE DROP ELEMENT

(71) Applicant: HUAWEI TECHNOLOGIES CO., LTD., Shenzhen, Guangdong (CN)

(72) Inventor: Giuseppe Gramegna, Munich (DE)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/910,554

(22) Filed: Mar. 2, 2018

(65) Prior Publication Data

US 2018/0198421 A1 Jul. 12, 2018

Related U.S. Application Data

(63) Continuation of application No. PCT/EP2016/060771, filed on May 12, 2016.

(51) Int. Cl.
*H03F 3/45* (2006.01)
*H03F 1/32* (2006.01)
*H03F 1/30* (2006.01)

(52) U.S. Cl.
CPC ........... *H03F 1/3211* (2013.01); *H03F 1/302* (2013.01); *H03F 3/45098* (2013.01);
(Continued)

(58) Field of Classification Search
CPC ..... H03F 3/45; H03F 3/45022; H03F 3/45049
(Continued)

(56) References Cited

U.S. PATENT DOCUMENTS 3,077,566 A * 2/1963 Vosteen .............. H03F 3/45071 330/255
3,401,350 A 9/1968 Barton et al.
5,072,194 A 12/1991 Chevallier
5,463,345 A 10/1995 Nagahori et al.
(Continued)

FOREIGN PATENT DOCUMENTS

| CN | 1312612 | 9/2001 |
|---|---|---|
| EP | 0414328 | 8/1990 |
| JP | 603218 | 1/1985 |

OTHER PUBLICATIONS

Lysenko, A. A. et al., *A Broadband Oscilloscope Amplifier for the Nanosecond Range*, Instruments and Experimental Techniques, Consultants Bureau, New York, US, vol. 16, No. 4, Jul. 1, 1973, XP001130606, pp. 1173-1175.
(Continued)

*Primary Examiner* — Steven J Mottola
(74) *Attorney, Agent, or Firm* — Womble Bond Dickinson (US) LLP

(57) ABSTRACT

A circuit comprises: a circuit input; a circuit output; at least one passive feedback loop coupled between the circuit output and the circuit input; an active element, coupled in a feed-forward path of the circuit between the circuit input and the circuit output and configured to drive the at least one feedback loop in order to establish a function of the circuit, wherein the feed-forward path of the circuit comprises a second node (Vx) and a first node which are internal nodes of the active element and which are coupled between the circuit input and the circuit output, wherein the first node is configured to have a first voltage, the first voltage being a function of the circuit output, wherein the active element comprises a first voltage drop element coupled between the second node (Vx) and the first node.

22 Claims, 7 Drawing Sheets

100
101 PGA
102 LPF
103 DRV
111
112
113

(52) U.S. Cl.
CPC ..... *H03F 3/45103* (2013.01); *H03F 3/45206* (2013.01); *H03F 3/45475* (2013.01); *H03F 2200/408* (2013.01); *H03F 2200/447* (2013.01); *H03F 2200/513* (2013.01); *H03F 2203/45101* (2013.01); *H03F 2203/45372* (2013.01); *H03F 2203/45512* (2013.01); *H03F 2203/45522* (2013.01); *H03F 2203/45528* (2013.01); *H03F 2203/45594* (2013.01); *H03F 2203/45628* (2013.01); *H03F 2203/45631* (2013.01); *H03F 2203/45646* (2013.01); *H03F 2203/45672* (2013.01); *H03F 2203/45681* (2013.01); *H03F 2203/45691* (2013.01); *H03F 2203/45701* (2013.01); *H03F 2203/45722* (2013.01)

(58) Field of Classification Search
USPC ................................ 330/252, 254, 256, 260
See application file for complete search history.

(56) References Cited

U.S. PATENT DOCUMENTS

| | | | | |
|---|---|---|---|---|
| 6,288,609 | B1 | 9/2001 | Brueske et al. | |
| 6,583,662 | B1 * | 6/2003 | Lim | H03H 11/126 327/553 |
| 7,889,006 | B1 | 2/2011 | Jones | |
| 2015/0326198 | A1 | 11/2015 | Stroet | |

OTHER PUBLICATIONS

International Search Report, dated Feb. 17, 2017, in International Application No. PCT/EP2016/060771 (5 pp.).

Written Opinion of the International Searching Authority, dated Feb. 17, 2017, in International Application No. PCT/EP2016/060771 (6 pp.).

Notice to Submit a Response, dated May 8, 2019, in Korean Application No. 10-2018-7004029 (11 pp.).

* cited by examiner

201

CIRCUIT WITH VOLTAGE DROP ELEMENT

CROSS-REFERENCE TO RELATED APPLICATIONS

This application is a continuation of International Application No. PCT/EP2016/060771, filed on May 12, 2016, which is hereby incorporated by reference in its entirety.

TECHNICAL FIELD

The present disclosure relates to a circuit with voltage drop element usable for linearity extension and noise reduction in DC coupled systems. The disclosure further relates to analog circuit design, specifically to DC coupled voltage amplifiers.

BACKGROUND

A typical DC coupled Analog baseband chain 100 is depicted in FIG. 1. In those systems the signal is amplified by a Programmable Gain Amplifier (PGA) 101, filtered by the Low Pass Filter (LPF) 102 and then transferred to the Driver (DRV) 103. The active blocks are obtained with a closed loop DC coupled voltage amplifier or operational amplifier (OPAMP) 111, 112, 113. Key specifics of an OPAMP are noise, linearity and power consumption.

Since the useful signal contains also the DC component, the DC common mode has to be propagated along the chain and each of the blocks of the chain (PGA 101, LPF 102 and DRV 103) needs to comply with this DC common mode. This is also valid for the OPAMP 111, 112, 113 used in the analog blocks.

Key performances of an analog block like noise, linearity, power consumption, are also dictated by the performances of the OPAMP 111, 112, 113 used. Typically, for a given power consumption, there is a trade-off between noise and linearity. In FIGS. 2*a* and 2*b* an analog PGA 200 is shown (FIG. 2*a*) together with its OPAMP 201 (FIG. 2*b*). This PGA 200 is an implementation of the PGA 101 shown in FIG. 1. Note that the need to have an OPAMP with low output impedance dictates the use of a voltage follower as output stage.

The PGA 200 includes an operational amplifier 201 having a first (non-inverse, +) input VIN+, a second (inverse, −) input VIN−, a first (non-inverse, +) output VOUT+, a second (inverse, −) output VOUT−. A first feedback path including resistor R2 is coupled between output VOUT+ and input VIN+. A second feedback path including resistor R2 is coupled between output VOUT− and input VIN−. The first input VIN+ of OPAMP 201 is coupled via resistor R1 to a first input VC_IN+ of PGA 200. The second input VIN− of OPAMP 201 is coupled via resistor R1 to a second input VC_IN− of PGA 200. The first output VOUT+ of OPAMP 201 is the first output of PGA 200. The second output VOUT− of OPAMP 201 is the second output of PGA 200.

The OPAMP 201 includes a non-inverse input path between a drive voltage VDD and ground GND including a first (non-inverse) current source MP+, a first (non-inverse) transistor Q1+ and a second current source Io. A control terminal of Q1+ is coupled to the first input VIN+ of the OPAMP 201. The OPAMP 201 includes a non-inverse output path between a drive voltage VDD and ground GND including a second (non-inverse) transistor QF+ and a third current source Iout. A control terminal of QF+ is coupled to a first (non-inverse) internal node Vx+ of the OPAMP 201 which is located between MP+ and Q1+. A first terminal of QF+ is coupled to the first output VOUT+ of the OPAMP 201. A second terminal of QF+ is coupled to the drive voltage VDD. The above described components are additionally used in inverse form as described in the following.

The OPAMP 201 further includes an inverse input path between a drive voltage VDD and ground GND including a first (inverse) current source MP−, a first (inverse) transistor Q1− and a second current source Io. A control terminal of Q1− is coupled to the second input VIN− of the OPAMP 201. The OPAMP 201 includes an inverse output path between a drive voltage VDD and ground GND including a second (inverse) transistor QF− and a third current source Iout. A control terminal of QF− is coupled to a first (inverse) node Vx− of the OPAMP 201 which is located between MP− and Q1−. A first terminal of QF− is coupled to the second output VOUT− of the OPAMP 201. A second terminal of QF− is coupled to the drive voltage VDD.

A capacitance Cs and a resistor Rs are coupled in parallel between the first terminal of Q1+ and the first terminal of Q1−.

Note that the OPAMP 201 can be realized as a differential OPAMP as depicted in FIG. 2 or alternatively as a non-differential OPAMP. The non-differential OPAMP 201 has only one first current source MP, one first transistor Q1, one second current source Io, one third current source Iout, one input and one output without the differentiation of non-inverse and inverse components.

FIG. 3 is a circuit diagram of the OPAMP 201 shown in FIGS. 1 and 2*a/b*. The OPAMP 201 can be used in the Low Pass Filter 102 shown in FIG. 1 or more generally in a closed loop system like for example PGA or DRV, e.g. PGA 101 or DRV 103 as shown in FIG. 1. With reference to the OPAMP 201, the typical trade-off noise linearity can be understood by writing the equivalent input noise as:

$$Vn_{IN}^2 = 4KT \cdot \left( \frac{1}{g_{m1}^2(Q_1)} \left( \frac{g_m(Q_1)}{1 + g_{m1}(Q_1) \cdot Rs} + \frac{1}{Rs} + \frac{2 \cdot Io}{Vov(M_P)} \right) \right)$$

where the overdrive voltage Vov(MP)=Vgs(MP)−Vth(MP) is the difference between gate-source voltage of MP and its threshold voltage; gm(Q1) is the transconductance of transistor Q1; and Io is the bias current.

By inspecting the equation above it is clear that voltage referred input noise is reduced when Vov(MP) is maximized.

As far as linearity is concerned, OPAMP 201 will be linear until MP acts as a current mirror, i.e. MP stays in the saturation region. This condition is met with Vds(MP)>Vov (MP). Since Vds(MP) will be set by maximum signal level, this means that linearity is maximized if Vov(MP) is minimized.

The trade-off on the choice of overdrive voltage Vov(MP) means that noise and linearity are conflicting requirements.

The addition of the DC common mode requirement makes things more complicated. In fact, to avoid a DC current going in or out of the LPF, the common mode of the input and output signals have to be the same. Furthermore, input and output common modes of the LPF are also dictated by preceding and following stages: this plus the need to have same common mode for input and output signals poses a considerable challenge, since input and output DC voltages that maximize linearity are not necessarily the same.

The additional constraint on linearity performance due to the DC coupled implementation is depicted in FIGS. 4*a* and 4*b*. In the assumption that the preceding stage set the common mode to VDD/2=1.25V, the voltage Vx at the base of the voltage follower will be ~2.05V. This voltage will make transistors MP compress much earlier than transistors Q1; therefore it is not optimal for linearity.

In this specific case, a lower common mode voltage at the input would improve headroom for MP transistor and overall linearity (current generators at the emitter of Q1 and Q2 have still enough headroom with the equivalent input signal level of FIG. 4) as illustrated in FIGS. 5*a* and 5*b*. Furthermore, but as anticipated before, when the filter is used in a communication system, DC points can be a function of preceding/following stages, therefore it is not always possible to set them to the level that maximises linearity.

SUMMARY

It is the object of the invention to provide an improved circuit design, in particular an amplifier circuit design, providing increased linearity under the constraint of DC common mode, in particular for an operational amplifier of a DC coupled voltage amplifier applicable in PGA, LPF and/or DRV components of an analog baseband chain as shown in FIG. 1.

This object is achieved by the features of the independent claims. Further implementation forms are apparent from the dependent claims, the description and the figures.

A basic idea of the invention is to that a DC voltage drop is generated across $1^{st}$ and $2^{nd}$ stage of an OPAMP to increase linearity. With this technique, optimum DC biasing points for the $1^{st}$ and $2^{nd}$ stage can be achieved. This maximizes the linearity under a given supply voltage. Furthermore, with the addition of a capacitance in parallel to the resistance used for the voltage drop, phase margin of the OPAMP is improved.

In order to describe the invention in detail, the following terms, abbreviations and notations will be used:

OPAMP: Operational Amplifier
PGA: Programmable Gain Amplifier
DRV: Driver
LPF: Low Pass Filter
Vov: Overdrive voltage
Vds: Drain Source voltage According to a first aspect, the invention relates to a circuit, comprising: a circuit input; a circuit output; at least one passive feedback loop coupled between the circuit output and the circuit input; an active element, in particular a DC coupled operational amplifier (OPAMP), coupled in a feed-forward path of the circuit between the circuit input and the circuit output and configured to drive the at least one feedback loop in order to establish a function of the circuit, wherein the feed-forward path of the circuit comprises a second node and a first node which are internal nodes of the active element and which are coupled between the circuit input and the circuit output, wherein the first node is configured to have a first voltage, the first voltage being a function of the circuit output, wherein the active element comprises a first voltage drop element coupled between the second node and the first node, and wherein the first voltage drop element is configured to decouple a DC level at the first node from a DC level at the second node and configured to provide the DC level at the first node independently from the DC level at the second node.

By introducing the first voltage drop element an improved amplifier circuit design can be provided having increased linearity for DC common mode. Such a circuit provides the following advantages: 1) Since optimum DC points for the $1^{st}$ and $2^{nd}$ stages can be independently chosen, linearity is maximised. 2) Higher flexibility in accommodating differences in DC common mode of preceding/following stages. 3) Higher Gain*Bandwidth Product, since the additional zero can cancel out secondary high frequency poles, therefore improving phase margin. 4) Control of OPAMP performances vs. temperature by using suitable thermal coefficients for Rb and current generator. 5) Reduction of noise performances under certain conditions.

In a first possible implementation form of the circuit according to the first aspect, the first voltage drop element is adjustable and configured to provide an adjustable voltage drop between first node and the second node.

When the first voltage drop element is adjustable, a fine-tuning can provide improved linearity.

In a second possible implementation form of the circuit according to the first aspect as such or according to the first implementation form of the first aspect, the first voltage drop element comprises: a voltage drop resistor and a voltage drop capacitor coupled in parallel between the first node and the second node; and a first current source coupled to the first node.

Such a voltage drop element can be easily implemented in a chip design. The voltage drop element creates a voltage drop between the $1^{st}$ and the $2^{nd}$ stage of the active element, e.g. an OPAMP.

The voltage drop resistor and the current generator allow one to increase the overdrive voltage of the current generator, thus reducing equivalent input noise. The voltage drop generated by the voltage drop resistor and the current generator allows one to optimize separately the $1^{st}$ and the $2^{nd}$ stage DC operating point; hence a higher linearity can be achieved.

In a third possible implementation form of the circuit according to the second implementation form of the first aspect, the first current source is configured to generate a current flowing into the first node such that a DC voltage at the first node is higher than a DC voltage at the second node.

This provides the advantage that the DC voltage at the first node is decoupled from the DC voltage at the second node.

In a fourth possible implementation form of the circuit according to the second implementation form of the first aspect, the first current source is configured to generate a current flowing out of the first node such that a DC voltage at the first node is lower than a DC voltage at the second node.

This provides the advantage that the DC voltage at the first node is decoupled from the DC voltage at the second node.

In a fifth possible implementation form of the circuit according to any of the second to the fourth implementation forms of the first aspect, the voltage drop resistor and the voltage drop capacitor are configured to introduce a zero into a transfer function of the active element.

The zero in the transfer function stabilizes the circuit. This zero improves phase margin and allows to increase Gain*Bandwidth product.

In a sixth possible implementation form of the circuit according to any of the second to the fifth implementation forms of the first aspect, a thermal coefficient of the first current source is positive in order to keep a voltage at the second node approximately constant with temperature.

This provides the advantage of improved linearity independent of the temperature.

In a seventh possible implementation form of the circuit according to any of the second to the sixth implementation forms of the first aspect, the active element comprises: a first transistor coupled to a first input terminal of the active element; and a second transistor coupled to a first output terminal of the active element, wherein the first transistor is coupled via the at least one feedback loop to the second transistor.

Such a transistor design can be easily implemented, e.g. by bipolar or FET transistor technology.

In an eighth possible implementation form of the circuit according to the seventh implementation form of the first aspect, the first transistor comprises a first terminal, a second terminal and a control terminal, wherein said control terminal is coupled to the first input terminal of the active element, the second transistor comprises a first terminal, a second terminal and a control terminal, wherein the said first terminal is coupled to the first output terminal of the active element; and the control terminal is coupled to the first node.

Such a transistor design can be efficiently implemented, e.g. by bipolar or FET transistor technology.

In a ninth possible implementation form of the circuit according to the eighth implementation form of the first aspect, the circuit comprises a coupling circuit coupled between the first node and the second terminal of the first transistor, wherein the coupling circuit comprises at least the voltage drop resistor and the voltage drop capacitor connected in parallel.

Such a coupling circuit can be easily implemented in a chip design.

In a tenth possible implementation form of the circuit according to any of the seventh to the ninth implementation forms of the first aspect, the active element comprises: a second current source coupled between the second terminal of the first transistor and a supply voltage; a third current source coupled between the first terminal of the first transistor and a ground terminal; and a fourth current source coupled between the first terminal of the second transistor and a ground terminal.

Such an active element can be easily implemented by using only a small number of electronic components.

In an eleventh possible implementation form of the circuit according to any of the seventh to the tenth implementation forms of the first aspect, the active element further comprises a load capacitance coupled between a supply voltage and the second terminal of the first transistor.

Such a load capacitance can be used for phase margin of the OPAMP.

In a twelfth possible implementation form of the circuit according to any of the seventh to the eleventh implementation forms of the first aspect, the active element is a differential voltage active element, further comprising: a third transistor coupled to a differential first input terminal of the active element; a fourth transistor coupled to a differential first output terminal of the active element; and a second voltage drop element corresponding to the first voltage drop element, wherein the third transistor is coupled via the second voltage drop element to the fourth transistor.

A differential voltage active element provides improved linearity.

In a thirteenth possible implementation form of the circuit according to the twelfth implementation form of the first aspect, the active element further comprises a cascode circuit coupled between the second terminal of the first transistor and the second terminal of the third transistor.

A cascode circuit provides the advantage of decoupling of the inverse and non-inverse parts resulting in improved linearity and stability.

According to a second aspect, the invention relates to an analog baseband circuit, comprising: a programmable gate array (PGA); a low pass filter (LPF) and a driver (DRV), which are DC coupled in series, wherein each of the PGA, LPF and DRV comprises a circuit according to the first aspect as such or any one of the preceding implementation forms of the first aspect.

This provides the advantage that the circuit can be easily applied for providing an analog baseband circuit with increased linearity.

According to a third aspect, the method relates to a method to increase linearity of an OPAMP by using a circuit according to the first aspect as such or any one of the implementation forms of the first aspect, in particular by using a first voltage drop element according to the first aspect as such or any one of the implementation forms of the first aspect.

Such a method allows to increase linearity of an OPAMP, to increase Gain*Bandwidth product of an OPAMP and to reduce noise of an OPAMP.

The method may be implemented with a resistance Rb, a capacitance Cb in parallel to Rb and a current generator Mb that create a voltage drop between the $1^{st}$ and the $2^{nd}$ stage of the OPAMP. The voltage drop generated by Rb and the current generator Mb allows one to optimize separately the $1^{st}$ and the $2^{nd}$ stage DC operating point; hence a higher linearity can be achieved. The resistance Rb and capacitance Cb arrangement synthesize a zero in the OPAMP closed loop transfer function. This zero improves phase margin and allows to increase Gain*Bandwidth product. Rb and the current generator allow one to increase the overdrive voltage of the current generator MP, thus reducing equivalent input noise.

BRIEF DESCRIPTION OF THE DRAWINGS

Further embodiments of the invention will be described with respect to the following figures, in which.

DETAILED DESCRIPTION OF THE EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described device, circuit or system may also hold true for a corresponding method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
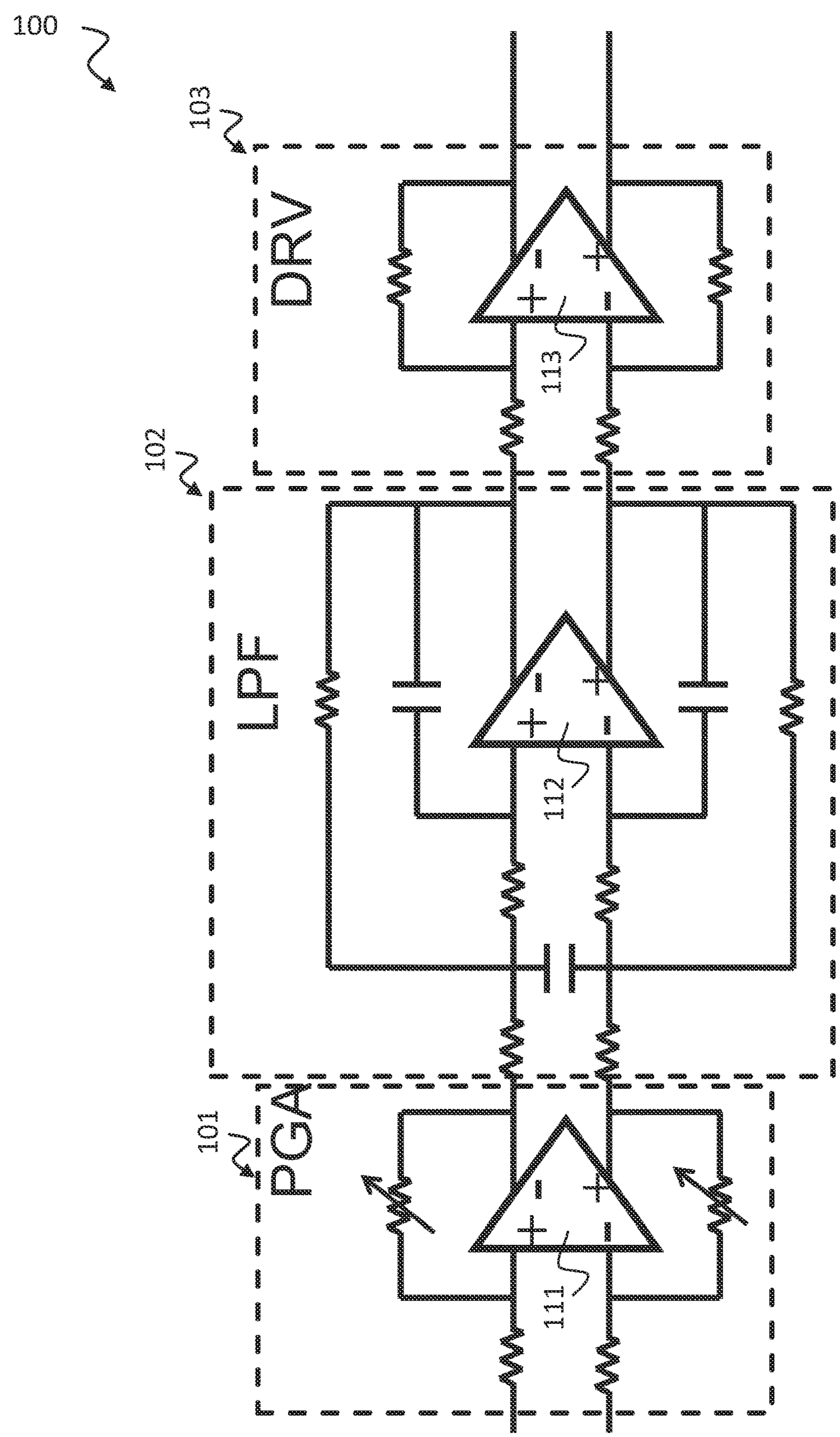
FIG. 1 shows a circuit diagram illustrating a DC coupled analog baseband chain 100.
Figure 2A:
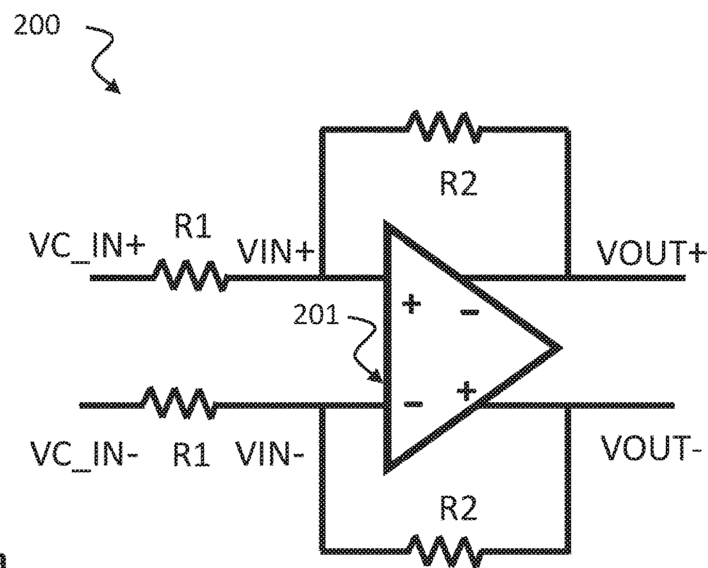
FIGS. 2*a* and 2*b* show circuit diagrams illustrating a programmable gain amplifier (PGA) 200 (FIG. 2*a*) and its operational amplifier (OPAMP) 201 (FIG. 2*b*)
Figure 2B:
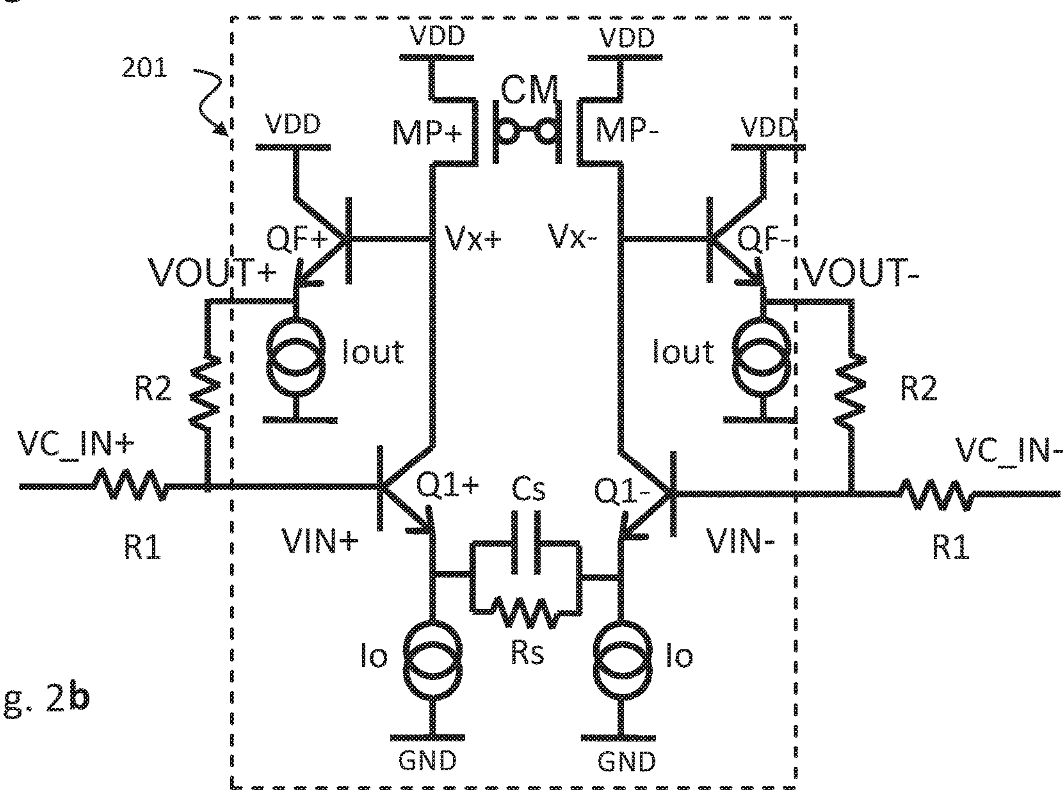
Figure 3:
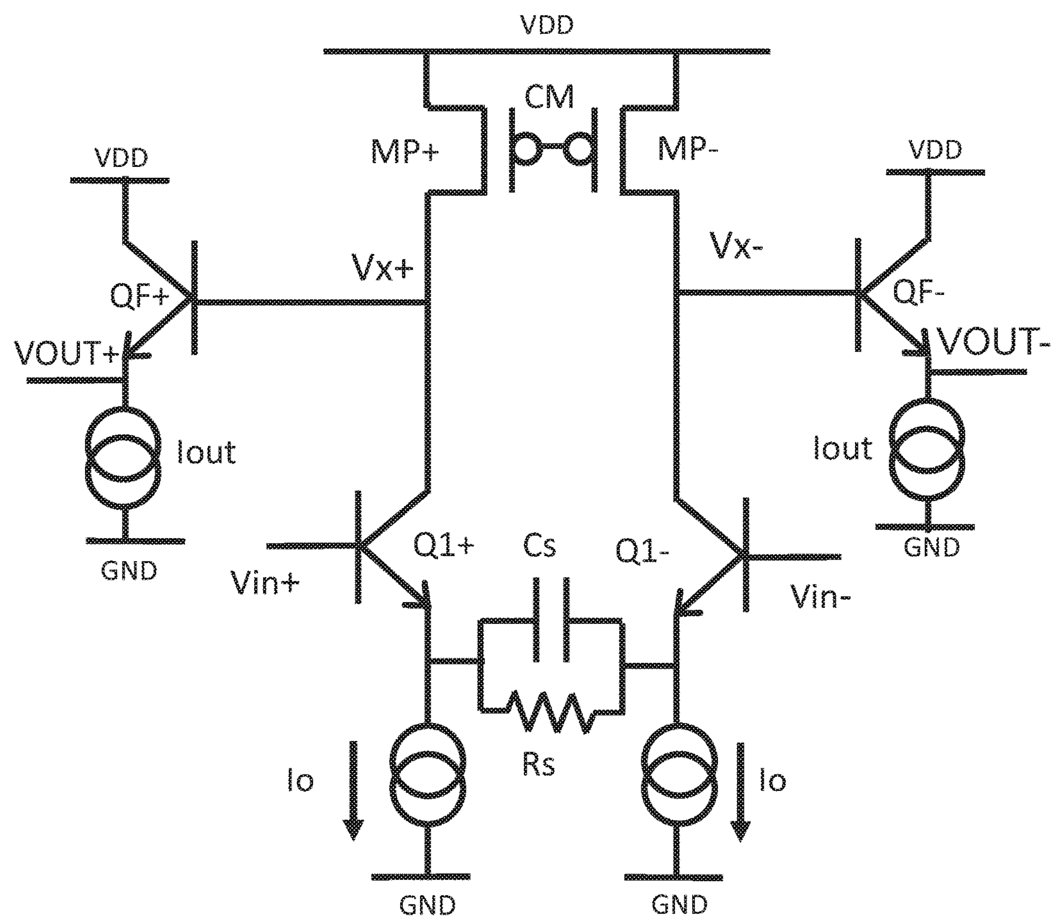
FIG. 3 shows a circuit diagram illustrating the OPAMP 201 of the PGA 200 shown in FIG. 2.
Figure 4A:
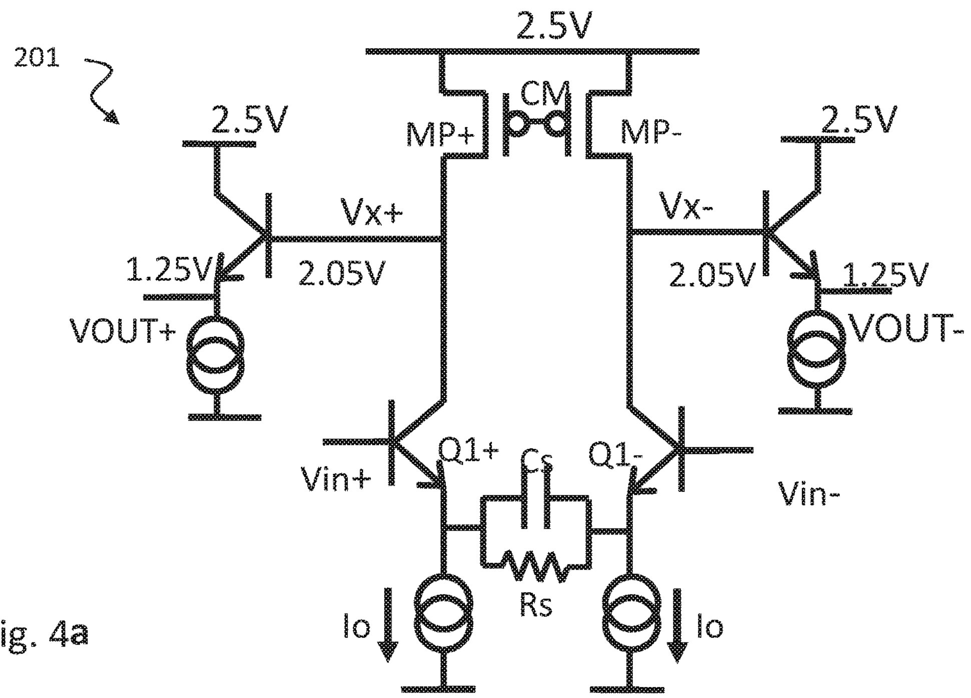
FIGS. 4*a* and 4*b* show the OPAMP 201 of FIG. 3 for a specific voltage setting (FIG. 4*a*) and voltage over time at internal node Vx− of the OPAMP 201 (FIG. 4*b*)
Figure 4B:
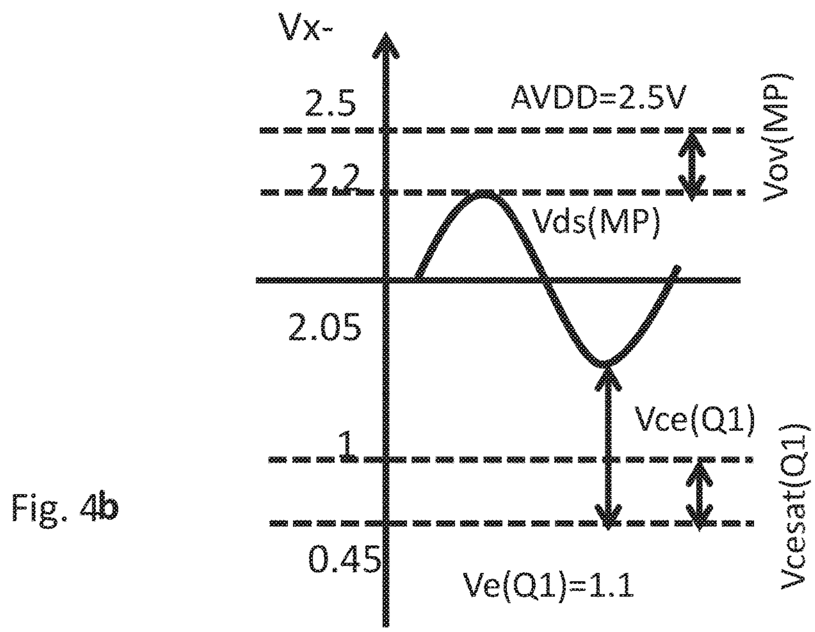
Figure 5A:
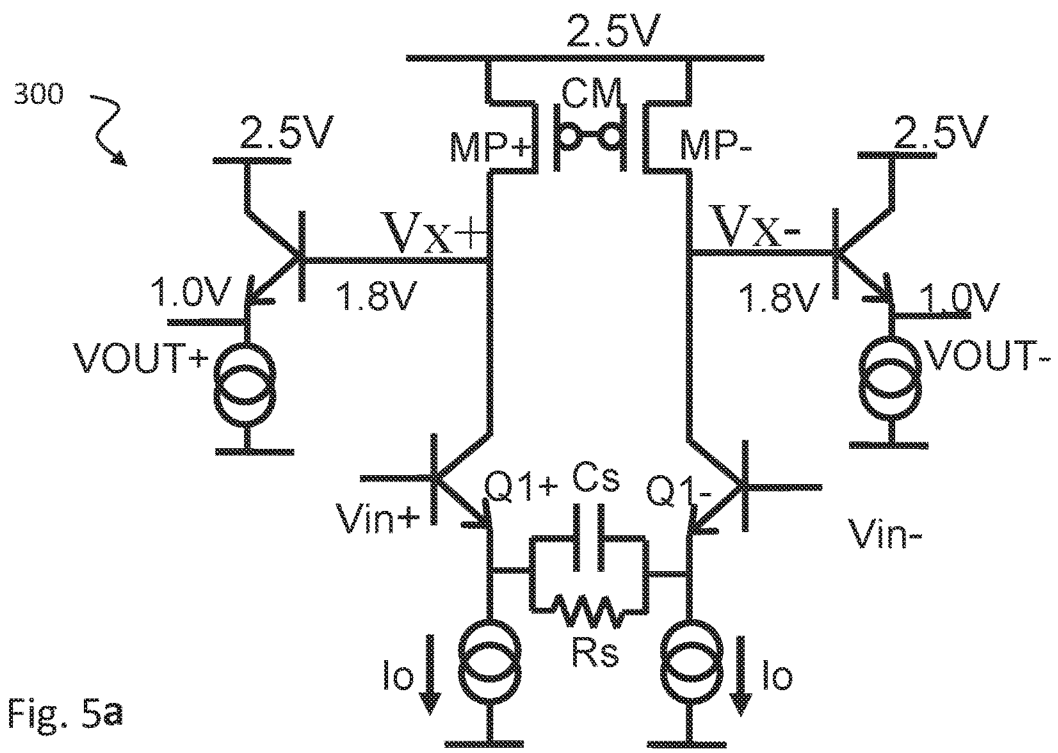
FIGS. 5*a* and 5*b* show the OPAMP 201 of FIG. 3 for another specific voltage setting (FIG. 5*a*) and voltage over time at internal node Vx− of the OPAMP 201 (FIG. 5*b*)
Figure 5B:
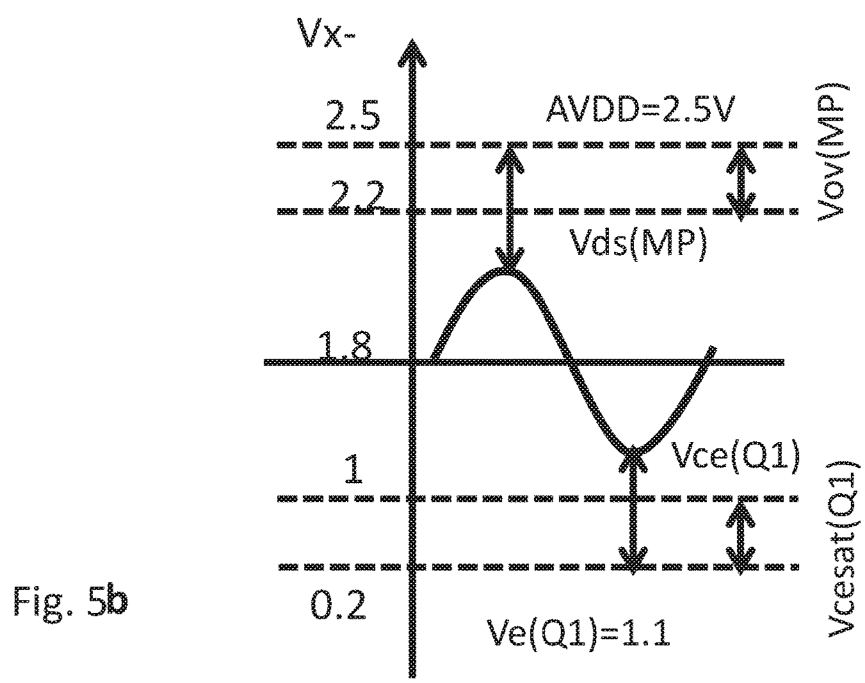
Figure 6:
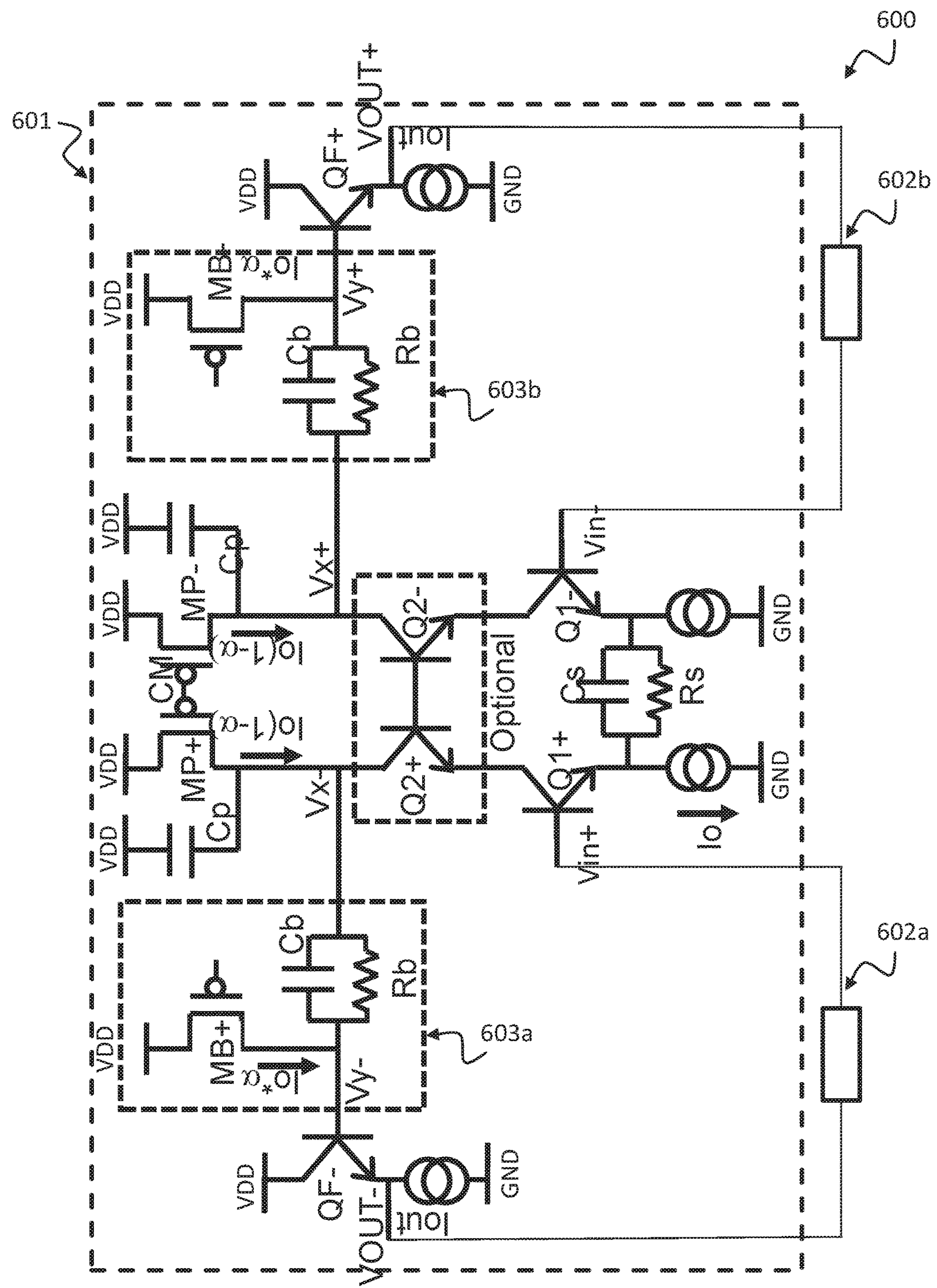
FIG. 6 shows a circuit diagram illustrating a circuit 600 according to the disclosure in a first implementation form.

FIG. 6 shows a circuit diagram illustrating a circuit 600 according to the disclosure in a first implementation form. The circuit 600 includes an active element 601 that may correspond to the OPAMP 201 described above with respect to FIGS. 1 to 5. The active element 601 is coupled in a feed-forward path of the circuit 600 between a circuit input VIN+, VIN− and a circuit output VOUT−, VOUT+. At least one feedback path 602*a*, 602 is coupled between the circuit output VOUT−, VOUT+ and the circuit input VIN+, VIN−. The feedback paths 602*a*, 602*b* may be realized as described above with respect to FIG. 1. In contrast to the OPAMP 201, the active element 601 additionally includes one or more voltage drop elements 603*a*, 603*b* in a feed-forward path of the active element 601 for decoupling a DC level at first node Vy from a DC level at a second node Vx of the active element 601 and to provide the DC level at the first node Vy independently from the DC level at the second node Vx.

The active element 601 includes a non-inverse input VIN+ and an inverse input VIN− which are inputs of the circuit 600 and a non-inverse output VOUT+ and an inverse output VOUT− which are outputs of the circuit 600.

A first feedback path 602*a* may include a resistor R2 coupled between output VOUT+ and input VIN+, e.g. as described above with respect to FIG. 2*a*. A second feedback path 602*b* may include a resistor R2 coupled between output VOUT− and input VIN−, e.g. as described above with respect to FIG. 2*a*. The first input VIN+ of the active element 601 may be coupled via resistor R1 to a first input VC_IN+ of the circuit 600, e.g. as described above with respect to FIG. 2*a*. The second input VIN− of the active element 601 may be coupled via resistor R1 to a second input VC_IN− of the circuit 600, e.g. as described above with respect to FIG. 2*a*.

The active element 601 includes a non-inverse input path between a drive voltage VDD and ground GND including a first (non-inverse) current source MP+, a first (non-inverse) transistor Q1+ and a second current source Io. A control terminal of Q1+ is coupled to the first input VIN+ of the active element 601. The active element 601 includes a non-inverse output path between a drive voltage VDD and ground GND including a second (inverse) transistor QF− and a third current source Iout. A control terminal of QF− forms a first (inverse) internal node Vy− and is coupled via the first voltage drop element 603*a* to a second (inverse) internal node Vx− of the active element 601 which is located between MP+ and Q1+. A first terminal of QF− is coupled to the second output VOUT− of the active element 601. A second terminal of QF− is coupled to the drive voltage VDD.

The non-inverse input path and the non-inverse output path are coupled by a first voltage drop element 603*a* which is included between first (inverse) internal node Vy− and second (inverse) internal node Vx− which is located at the control terminal of QF−. The first voltage drop element 603*a* includes a parallel circuit of a capacitance Cb and a resistor Rb coupled between the first (inverse) internal node Vy− and the second (inverse) internal node Vx− and a (non-inverse) current source MB+ which is coupled between the first (inverse) internal node Vy− and ground GND.

The above described components are additionally used in inverse form as described in the following.

The active element 601 further includes an inverse input path between a drive voltage VDD and ground GND including a first (inverse) current source MP−, a first (inverse) transistor Q1− and a second current source Io. A control terminal of Q1− is coupled to the second input VIN− of the active element 601. The active element 601 includes an inverse output path between a drive voltage VDD and ground GND including a second (non-inverse) transistor QF+ and a third current source Iout. A control terminal of QF+ forms a first (non-inverse) internal node Vy+ and is coupled via the second voltage drop element 603*b* to a second (non-inverse) internal node Vx+ of the active element 601 which is located between MP− and Q1−. A first terminal of QF+ is coupled to the first output VOUT+ of the active element 601. A second terminal of QF+ is coupled to the drive voltage VDD.

The inverse input path and the inverse output path are coupled by the second voltage drop element 603*b* which is included between first (non-inverse) internal node Vy+ and second (non-inverse) internal node Vx+ which is located at the control terminal of QF+. The second voltage drop element 603*b* includes a parallel circuit of a capacitance Cb and a resistor Rb coupled between the first (non-inverse) internal node Vy+ and the second (non-inverse) internal node Vx+ and an (inverse) current source MB− which is coupled between the first (non-inverse) internal node Vy+ and ground GND.

A capacitance Cs and a resistor Rs are coupled in parallel between the first terminal of Q1+ and the first terminal of Q1−.

Note that the active element 601 can be realized as a differential OPAMP as depicted in FIG. 6 or alternatively as a non-differential OPAMP. The non-differential OPAMP 601 has only one first current source MP, one first transistor Q1, one second current source Io, one third current source Iout, one voltage drop element, one input and one output without the differentiation of non-inverse and inverse components.

The first and/or second transistors Q1+, Q1−, QF+, QF− may be realized as bipolar transistors; in this case the control terminal is a base terminal, the first terminal is an emitter terminal and the second terminal is a collector terminal. Alternatively, the first and/or second transistors Q1+, Q1−, QF+, QF− may be realized as Field Effect transistors; in this case the control terminal is a gate terminal, the first terminal is a source terminal and the second terminal is a drain terminal.

Note that the active element 601 can be realized as a differential active element or alternatively as a non-differential active element. The differential active element is shown in FIG. 6 while a non-differential active element comprises of half the elements as depicted in FIG. 6, i.e. one first current source MP, one first transistor Q1, one second current source Iin, one third current source Iout, one input and one output without the differentiation of non-inverse and inverse components.

A basic design of the circuit 600 can be described using the following words: The circuit 600 includes: a circuit input VIN; a circuit output VOUT; at least one passive feedback loop 602*a*, 602*b* coupled between the circuit output and the circuit input; an active element 601, in particular a DC coupled operational amplifier (OPAMP), coupled in a feed-forward path of the circuit 600 between the circuit input and the circuit output and configured to drive the at least one feedback loop in order to establish a function of the circuit. The feed-forward path of the circuit 600 comprises a second node Vx and a first node Vy which are internal nodes of the active element 601 and which are coupled between the circuit input and the circuit output. The first node Vy is configured to have a first voltage, the first voltage being a function of the circuit output. The active element 601 comprises a first voltage drop element 603*a* coupled between the second node Vx and the first node Vy. The first voltage drop element 603*a* is configured to decouple a DC level at the first node from a DC level at the second node and configured to provide the DC level at the first node independently from the DC level at the second node Vx.

The first voltage drop element 603*a* may be adjustable and configured to provide an adjustable voltage drop between first node Vy and the second node Vx. The first voltage drop element 603*a* may include: a voltage drop resistor Rb and a voltage drop capacitor Cb coupled in parallel between the first node Vy and the second node Vx; and a first current source Mb coupled to the first node Vy.

The first current source Mb may generate a current Io flowing into the first node Vy such that a DC voltage at the first node Vy is higher than a DC voltage at the second node Vx. Alternatively, the first current source Mb may generate a current flowing out of the first node Vy such that a DC voltage at the first node Vy is lower than a DC voltage at the second node Vx.

The voltage drop resistor Rb and the voltage drop capacitor Cb may be configured to introduce a zero into a transfer function of the active element 601. A thermal coefficient of the first current source Mb may be positive in order to keep a voltage at the second node Vx approximately constant with temperature.

The active element 601 may include: a first transistor Q1+ coupled to a first input terminal Vin+ of the active element 601; and a second transistor QF− coupled to a first output terminal Vout− of the active element 601. The first transistor Q1+ may be coupled via the at least one feedback loop 602*a* to the second transistor QF−.

The first transistor Q1+ may include a first terminal, a second terminal and a control terminal. Said control terminal may be coupled to the first input terminal Vin+ of the active element 601. The second transistor QF− may include a first terminal, a second terminal and a control terminal. Said first terminal may be coupled to the first output terminal Vout− of the active element 601. The control terminal may be coupled to the first node Vy.

The circuit 600 may further include a coupling circuit coupled between the first node Vy and the second terminal of Q1+. The coupling circuit may include at least the voltage drop resistor Rb and the voltage drop capacitor Cb connected in parallel.

The active element 601 may include: a second current source MP+ coupled between the second terminal of Q1+ and a supply voltage; a third current source Io coupled between the first terminal of Q1+ and a ground terminal; and a fourth current source Iout coupled between the first terminal of QF− and a ground terminal.

The active element 601 may further include a load capacitance Cp coupled between a supply voltage and the second terminal of Q1+. The active element 601 may be a differential voltage active element, further including: a third transistor Q1− coupled to a differential first input terminal Vin− of the active element; a fourth transistor QF+ coupled to a differential first output terminal Vout+ of the active element; and a second voltage drop element corresponding to the first voltage drop element. The third transistor Q1− may be coupled via the second voltage drop element to the fourth transistor QF+.

The active element 601 may further include a cascode circuit coupled between the second terminal of Q1+ and the second terminal of Q1−.

The circuit 600 may be used in an analog baseband circuit, e.g. an analog baseband circuit 100 as described above with respect to FIG. 1. The analog baseband circuit 100 may include a programmable gate array (PGA) 101; a low pass filter (LPF) 102 and a driver (DRV) 103, which are DC coupled in series, wherein each of the PGA 101, LPF 102 and DRV 103 comprises a circuit 600 as described above.

The circuit 600 solves the above mentioned problems by introducing the voltage drop elements 603*a*, 603*b*, i.e. the combination of a resistance Rb, capacitance Cb and an additional current generator. The voltage drop elements 603*a*, 603*b* act in the following way: 1) Rb and the current generator Mb create a DC voltage drop that optimizes simultaneously the DC operating points for the $1^{st}$ and the $2^{nd}$ stage. 2) Rb, Cb introduces a zero at high-frequency that improves phase margin of the OPAMP, i.e. the active element 601. 3) Rb and the current generator Mb can have a suitable thermal coefficient in order to provide the desired DC bias point for node Vx. This feature can be used to ensure desired linearity performances for different temperatures. 4) Under certain conditions (high Gain of the OPAMP), the circuit 600 has improved noise performance.

As far as point (3), Rb and the current generator can have a suitable thermal coefficient in order to provide the desired DC bias point for node Vx. This feature can be used to ensure desired linearity performances for different temperatures. An example is reported below. The DC voltage Vx can be written as:

$$Vx = V\mathrm{OUT} + Vbe(QF) + R*Io*\alpha.$$

Its derivative versus temperature can be written as:

$$dVx/dT = dV\mathrm{OUT}/dT + dVbe(QF)/dT + R*\alpha*dIo/dT.$$

Assuming a constant DC value versus temperature is desired for Vx and that DC voltage VOUT does not change with temperature, dVx/dt=0 imposes dIo/dT=−dVbe/dT/(α*R), so the current generator needs to have a positive temperature coefficient(dVbe/dT is negative).

In practice, the circuit 600 allows a temperature control of the DC voltage at node Vx in order to provide desired performances versus temperature.

As anticipated, under certain conditions the circuit improves at the same time linearity and noise performances (point 4). This can be shown by comparing the circuit 300 without voltage drop elements against the circuit 600 including the voltage drop element and deriving input voltage noise equations:

Input equivalent voltage noise $V_{IN}$− circuit 300:

$$V_{IN}^2 = 4KT \cdot \left( \frac{1}{g(Q_1)_{m1}^2} \left( \frac{g_m(Q_1)}{1 + g_{m1}(Q_1) \cdot Rs} + \frac{1}{Rs} + \frac{2 \cdot Io}{Vov(M_P)} \right) \right).$$

Input equivalent voltage noise $\mathrm{Vinv}_{IN}$− circuit 600 (in case gm(Q1)*Rds(MP) very high, as in the case of typical OPAMP):

$$Vinv_{IN}^2 = 4KT \cdot \left( \frac{1}{g(Q_1)_{m1}^2} \left( \frac{g_m(Q_1)}{1 + g_{m1}(Q_1) \cdot Rs} + \frac{1}{Rs} + \frac{2 \cdot Io \cdot (1-\alpha)}{Vov(M_P)} + \frac{2 \cdot Io \cdot \alpha}{Vov(M_B)} \right) \right).$$

In order to compare the two equations one can re-write the input equivalent voltage noise of the circuit 300 in the following way:

$$V_{IN}^2 = 4KT \cdot \left( \frac{1}{g(Q_1)_{m1}^2} \left( \frac{g_m(Q_1)}{1 + g_{m1}(Q_1) \cdot Rs} + \frac{1}{Rs} + \frac{2 \cdot Io \cdot (1-\alpha)}{Vov(M_P)} + \frac{2 \cdot Io \cdot \alpha}{Vov(M_P)} \right) \right).$$

Since Vov(MP) of circuit 600 can be made bigger than Vov(MP) of circuit 300 due to more hadroom available for transistor MP (thanks to the DC voltage drop), it results that $Vinv_{IN} < V_{IN}$. In conclusion, under certain conditions, the disclosed circuit 600 yields also better noise performances.

Note that all considerations above hold also in the case where two cascade transistors Q2+/Q2− are included between Vx− and Vx+ as depicted in FIG. 6. The same principle of using voltage drop elements can also be applied to systems that are NOT DC coupled.

Hence, the circuit 600 provides the following advantages: Since optimum DC points for the 1$^{st}$ and 2$^{nd}$ stages can be independently chosen, linearity is maximised; Higher flexibility in accommodating differences in DC common mode of preceding/following stages; Higher Gain*Bandwidth Product, since the additional zero can cancel out secondary high frequency poles, therefore improving phase margin; Control of OPAMP performances versus temperature by using suitable thermal coefficients for Rb and current generator; and reduction of noise performances under certain conditions.

Figure 7:
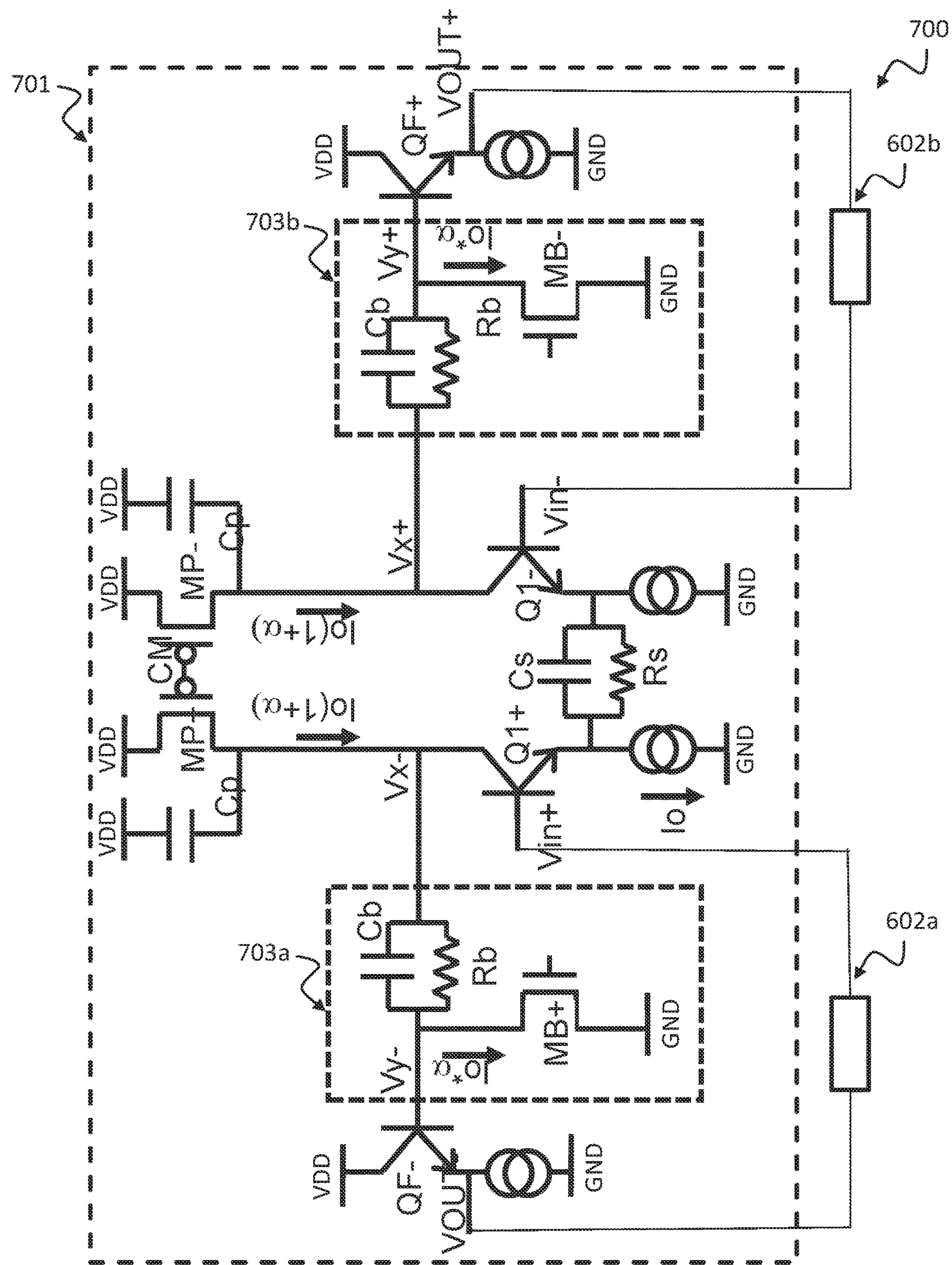
FIG. 7 shows a circuit diagram illustrating a circuit 700 according to the disclosure in a second implementation form.

FIG. 7 shows a circuit diagram illustrating a circuit 700 according to the disclosure in a second implementation form.

The circuit 700 corresponds to the circuit 600 described above with respect to FIG. 6; however the current sources MB+, MB− of the voltage drop elements 603*a*, 603*b* are not coupled to the reference voltage VDD, instead MB+ and MB− are coupled to ground GND. These different voltage drop elements used for the circuit 700 are referred to as 703*a* and 703*b*.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A circuit, comprising:
- a circuit input;
- a circuit output;
- at least one passive feedback loop coupled between the circuit output and the circuit input; and
- an active circuit, coupled between the circuit input and the circuit output and configured to drive the at least one feedback loop,
- wherein the active circuit comprises a second node and a first node which are internal nodes of the active circuit and which are coupled between the circuit input and the circuit output,
- wherein the active circuit comprises a first voltage drop circuit coupled between the second node and the first node,
- wherein the first voltage drop circuit is configured to decouple a DC level at the first node from a DC level at the second node and configured to provide the DC level at the first node independently from the DC level at the second node, and
- wherein the first voltage drop circuit is adjustable and configured to provide an adjustable voltage drop between the first node and the second node.

2. The circuit of claim 1, wherein the first voltage drop circuit comprises:
- a voltage drop resistor and a voltage drop capacitor coupled in parallel between the first node and the second node; and
- a first current source coupled to the first node.

3. The circuit of claim 2,
- wherein the first current source is configured to generate a current flowing into the first node such that a DC voltage at the first node is higher than a DC voltage at the second node.

4. The circuit of claim 2,
- wherein the first current source is configured to generate a current flowing out of the first node such that a DC voltage at the first node is lower than a DC voltage at the second node.

5. The circuit of claim 2, wherein the voltage drop resistor and the voltage drop capacitor are configured to introduce a zero into a transfer function of the active circuit.

6. The circuit of claim 2, wherein a thermal coefficient of the first current source is positive in order to keep a voltage at the second node approximately constant with temperature.

7. The circuit of claim 2, wherein the active circuit comprises:

a first transistor coupled to a first input terminal of the active circuit; and a second transistor coupled to a first output terminal of the active circuit, wherein the first transistor is coupled via the at least one feedback loop to the second transistor.

8. The circuit of claim 7, wherein the first transistor comprises a first terminal, a second terminal and a control terminal, wherein said control terminal is coupled to the first input terminal of the active circuit, wherein the second transistor comprises a first terminal, a second terminal and a control terminal, wherein the said first terminal is coupled to the first output terminal of the active circuit, and wherein the control terminal is coupled to the first node.

9. The circuit of claim 8, comprising:

a coupling circuit coupled between the first node and the second terminal of the first transistor, wherein the coupling circuit comprises at least the voltage drop resistor and the voltage drop capacitor connected in parallel.

10. The circuit of claim 7, wherein the active circuit comprises:

a second current source coupled between the second terminal of the first transistor and a supply voltage;

a third current source coupled between the first terminal of the first transistor and a ground terminal; and a fourth current source coupled between the first terminal of the second transistor and a ground terminal.

11. The circuit of claim 7, wherein the active circuit further comprises:

a load capacitance coupled between a supply voltage and the second terminal of the first transistor.

12. The circuit of claim 7, wherein the active circuit is a differential voltage active circuit, further comprising:

a third transistor coupled to a differential first input terminal of the active circuit;

a fourth transistor coupled to a differential first output terminal of the active circuit; and a second voltage drop circuit corresponding to the first voltage drop circuit, wherein the third transistor is coupled via the second voltage drop circuit to the fourth transistor.

13. The circuit of claim 12, wherein the active circuit further comprises:

a cascade circuit coupled between the second terminal of the first transistor and the second terminal of the third transistor.

14. An analog baseband circuit, comprising:

a programmable gate array (PGA);

a low pass filter (LPF); and a driver, which are DC coupled in series, wherein each of the PGA, LPF and driver (DRV) comprises: a circuit comprising:

a circuit input;

a circuit output;

at least one passive feedback loop coupled between the circuit output and the circuit input; and an active circuit, coupled between the circuit input and the circuit output and configured to drive the at least one feedback loop, wherein the active circuit comprises a second node and a first node which are internal nodes of the active circuit and which are coupled between the circuit input and the circuit output, wherein the active circuit comprises a first voltage drop circuit coupled between the second node and the first node, wherein the first voltage drop circuit is configured to decouple a DC level at the first node from a DC level at the second node and configured to provide the DC level at the first node independently from the DC level at the second node.

15. The analog baseband circuit of claim 14, wherein the first voltage drop circuit is adjustable and configured to provide an adjustable voltage drop between first node and the second node.

16. The analog baseband circuit of claim 14, wherein the first voltage drop circuit comprises:

a voltage drop resistor and a voltage drop capacitor coupled in parallel between the first node and the second node; and a first current source coupled to the first node.

17. The analog baseband circuit of claim 16, wherein the active circuit comprises:

a first transistor coupled to a first input terminal of the active circuit; and a second transistor coupled to a first output terminal of the active circuit, wherein the first transistor is coupled via the at least one feedback loop to the second transistor.

18. A circuit, comprising:

a circuit input;

a circuit output;

at least one passive feedback loop coupled between the circuit output and the circuit input; and an active circuit, coupled between the circuit input and the circuit output and configured to drive the at least one feedback loop, wherein the active circuit comprises a pre-amplifier coupled to the circuit input, a post-amplifier coupled to the circuit output, and a first voltage drop circuit coupled between a first node and a second node, wherein the first node is an input node of the post-amplifier and the second node is an output node of the pre-amplifier, wherein the pre-amplifier and the post-amplifier are two neighboring amplifier stages, and wherein the first voltage drop circuit is configured to provide a DC level at the first node independently from a DC level at the second node.

19. The circuit of claim 18, wherein the first voltage drop circuit is adjustable and configured to provide an adjustable voltage drop between the first node and the second node.

20. The circuit of claim 19, wherein the first voltage drop circuit comprises:

a voltage drop resistor and a voltage drop capacitor coupled in parallel between the first node and the second node, and a first current source coupled to the first node.

21. The circuit of claim 18, wherein the pre-amplifier comprises:

a second current source coupled to the second node;

a first transistor coupled to the second node, wherein a control terminal of the first transistor is coupled to the circuit input; and a third current source coupled to the first transistor.

22. The circuit of claim 18, wherein the post-amplifier comprises:

a second transistor coupled between the first node and the circuit output, wherein a control terminal of the second transistor is coupled to the first node; and a fourth current source coupled to the second transistor.

* * * * *